US005831264A

United States Patent [19]
Shedd et al.

[11] Patent Number: 5,831,264
[45] Date of Patent: Nov. 3, 1998

[54] ELECTROSTRICTIVE ACTUATOR FOR SCANNED-PROBE MICROSCOPE

[75] Inventors: Gordon M. Shedd; David J. Ray, both of Honeoye Falls, N.Y.

[73] Assignee: Burleigh Instruments, Inc., Fishers, N.Y.

[21] Appl. No.: 736,045

[22] Filed: Oct. 22, 1996

[51] Int. Cl.$^6$ .......................... H01J 37/256; H01J 37/28; H01L 41/08
[52] U.S. Cl. .............................................. 250/306; 73/105
[58] Field of Search ................................ 250/306; 73/105

[56] References Cited

U.S. PATENT DOCUMENTS

| | | | |
|---|---|---|---|
| 5,198,715 | 3/1993 | Elings et al. | 250/306 |
| 5,260,572 | 11/1993 | Marshall | 250/306 |
| 5,306,919 | 4/1994 | Elings et al. | 250/442.11 |
| 5,388,452 | 2/1995 | Harp et al. | 73/105 |
| 5,483,064 | 1/1996 | Frey et al. | 250/442.11 |

OTHER PUBLICATIONS

Hues et al., "Effect Of PZT And PMN Actuator Husteresis And Creep On Nanoindentation Measurements Using Force Microscopy," *Rev. Sci. Instrum*, 1994, vol. 65, No. 5, pp. 1561–1565.

*Primary Examiner*—Jack I. Berman
*Attorney, Agent, or Firm*—Jaeckle Fleischmann & Mugel, LLP

[57] ABSTRACT

The electrostrictive actuator device of the present invention, which controls relative movement in a scanned-probe microscope between the tip of a probe and the surface of a sample, comprises two thin-walled cylindrical members formed of electrostrictive material. The first cylindrical member, which is connected to the microscope, has on each of its inner and outer surfaces a conductive layer that forms at least one electrode. Applying voltages to the electrodes on the inner and outer surfaces of the first cylindrical member controls the two-dimensional X-Y horizontal relative movement between the probe tip and the sample surface. The second cylindrical member of the actuator device is coaxially connected at one end with the first cylindrical member and at its opposite end with the sample or the probe. Both the inner and outer surfaces of the second member have conductive layers, each of which forms an electrode. Applying voltages to the electrodes on the inner and outer surfaces of the second cylindrical member controls the Z-direction vertical relative movement of the probe tip on or near the sample surface. In preferred embodiments of the actuator device of the invention, either or both of the conductive layers on the inner and outer surfaces of the first cylindrical member may comprise two opposite pairs of spaced apart electrodes. Also in accordance with the invention, a scanned-probe microscope apparatus comprises a microscope and the just-described electrostrictive actuator device comprising first and second cylindrical members for controlling, respectively, X-Y horizontal and Z-direction vertical movements.

27 Claims, 3 Drawing Sheets

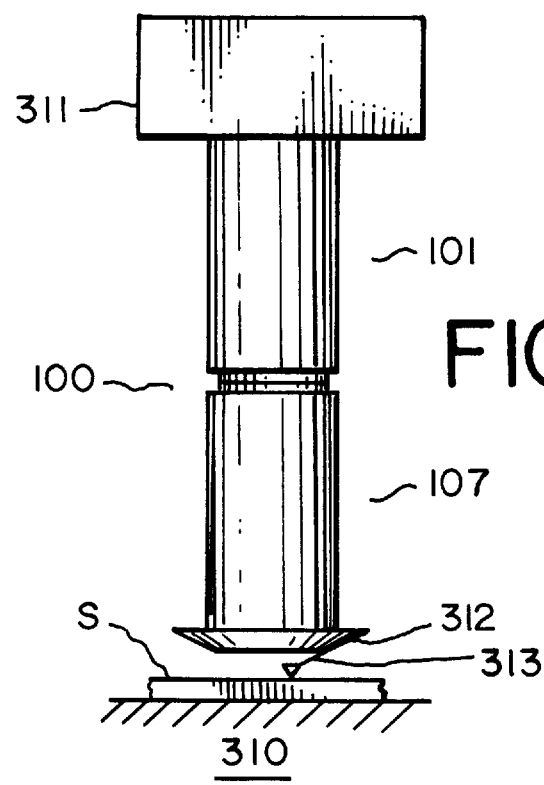
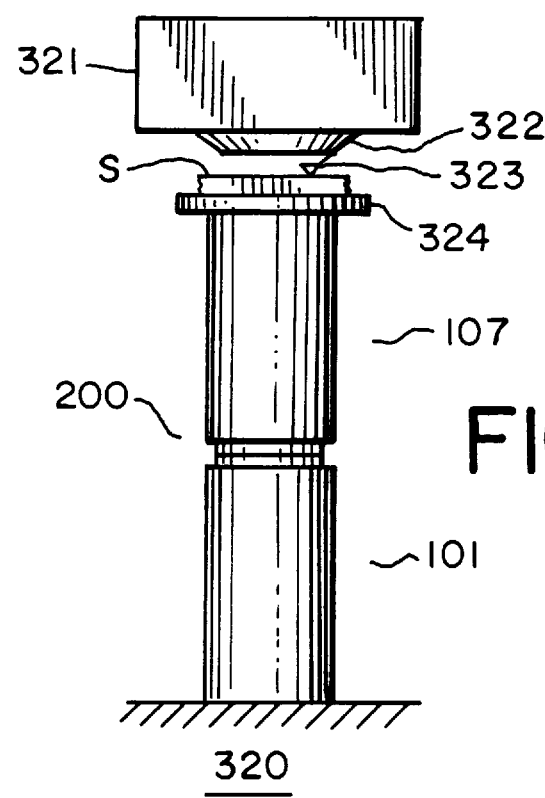

ELECTROSTRICTIVE ACTUATOR FOR SCANNED-PROBE MICROSCOPE

FIELD OF THE INVENTION

The present invention relates to scanned-probe microscopy and, more particularly, to an electrostrictive actuator for controlling probe tip movement in a scanned-probe microscope apparatus.

BACKGROUND OF THE INVENTION

Traditional optical microscopes that use lenses to focus visible light radiation are limited by the diffraction of the radiation to resolve details no smaller than about 200–250 nanometers. However, atomic scale details of samples can be resolved by a class of microscope generally referred to as scanned-probe microscopes. One such type of instrument, a scanned tunneling microscope, utilizes an electrical potential across the gap between a sharp probe tip and a sample surface to form a measurable tunneling current of tip and sample surface electrons. Another type of microscope, known as an atomic force or scanning force microscope, makes use of the interatomic forces arising between atoms of the sharp tip and sample surface atoms. These forces cause measurable deflection of a cantilever bearing the tip. The combination of cantilever and tip comprises a probe.

In a scanned-probe microscope, the surface of a sample may be horizontally (X, Y) raster scanned over approximately a 20×20 nanometer area, while measuring variations in the vertical (Z) direction over a range of about 2 nanometers. The X, Y raster scan may be carried out either by scanning the probe tip over the sample surface or by scanning the sample surface under the probe tip.

Scanning measurements may be made by causing a cantilever bearing the tip to vibrate near the cantilever resonant frequency using, for example, a piezoelectric (PZT) transducer. Scanning elements, which typically also are PZT materials in the shape of ceramic tubes provided with electrodes on the inner and outer surfaces, are described in U.S. Pat. Nos. 5,306,919; 5,388,452; and 5,483,064, the disclosures of which are incorporated herein by reference.

U.S. Pat. No. 5,260,572, the disclosure of which is incorporated herein by reference, describes a scanning probe microscope having a position translator, a probe sensing element, and an actuator that may be made of a PZT or a PMN material. Hues et al., "Effect of PZT and PMN actuator hysteresis and creep on nanoindentation measurements using force microscopy," *Rev. Sci. Instrum.*, 1994, vol. 65, no. 5, pp 1561–1565, describes the use of PMN in place of PZT actuators to improve the reliability of single axis indentation measurements.

Scanning by PZT elements is adversely affected by hysteresis that occurs during the electromechanical scanning cycles. Nonlinear response to applied scanning voltages and creep are examples of other problems common to PZT scanners. Mitigating these effects to improve the reliability and reproducibility of scanned-probe microscopic measurements would be highly desirable. The device of the present invention provides this benefit.

SUMMARY OF THE INVENTION

The electrostrictive actuator device of the present invention, which controls relative movement in a scanned-probe microscope between the tip of a probe and the surface of a sample, comprises two thin-walled cylindrical members formed of electrostrictive material. The first cylindrical member, which is connected to the microscope, has on each of its inner and outer surfaces a conductive layer that forms at least one electrode. Applying voltages to the electrodes on the inner and outer surfaces of the first cylindrical member controls the two-dimensional X-Y horizontal relative movement between the probe tip and the sample surface.

The second cylindrical member of the actuator device is coaxially connected at one end with the first cylindrical member and at its opposite end with the sample or the probe. Both the inner and outer surfaces of the second member have conductive layers, each of which forms an electrode. Applying voltages to the electrodes on the inner and outer surfaces of the second cylindrical member controls the Z-direction vertical relative movement of the probe tip on or near the sample surface.

In preferred embodiments of the actuator device of the invention, either or both of the conductive layers on the inner and outer surfaces of the first cylindrical member may comprise two opposite pairs of spaced apart electrodes.

Also in accordance with the invention, a scanned-probe microscope apparatus comprises a microscope and the just-described electrostrictive actuator device comprising first and second cylindrical members for controlling, respectively, X-Y horizontal and Z-direction vertical movements.

The invention is further directed to a process for examining the surface of a sample using a microscope provided with an electrostrictive actuator device for controlling movement between a tip of a probe and the sample surface. The process comprises applying selected voltages to conductive layer electrodes disposed on inner and outer surfaces of a first thin-walled cylindrical member that is formed of electrostrictive material and is connected to the microscope. The voltages applied to the first cylindrical member electrodes control two-dimensional X-Y horizontal movement between the probe tip and the sample surface.

The process of the invention further comprises applying selected voltages to conductive layer electrodes on the inner and outer surfaces of a second thin-walled cylindrical member formed of electrostrictive material and coaxially connected at one end with the first cylindrical member and at the opposite end with the probe or the sample. The voltages applied to the second cylindrical member electrodes control the Z-direction vertical relative movement of the probe tip on or near the sample surface.

BRIEF DESCRIPTION OF THE DRAWINGS

FIGS. 3A and 3B are schematic representations of two embodiments of a scanned-probe microscope apparatus of the present invention.

DETAILED DESCRIPTION OF THE INVENTION

Figure 1:
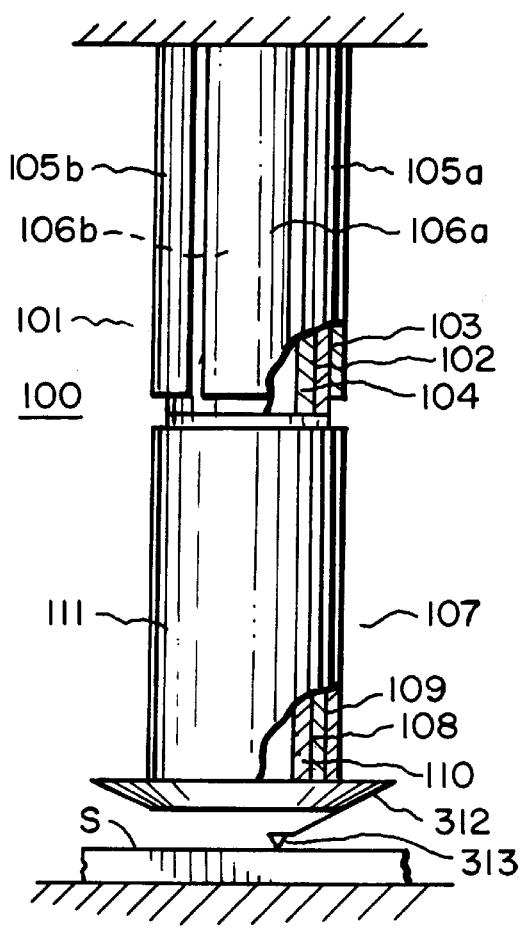
FIG. 1 is a side view, partially cut away, of one embodiment of a PMN actuator device of the present invention.
Figure 2:
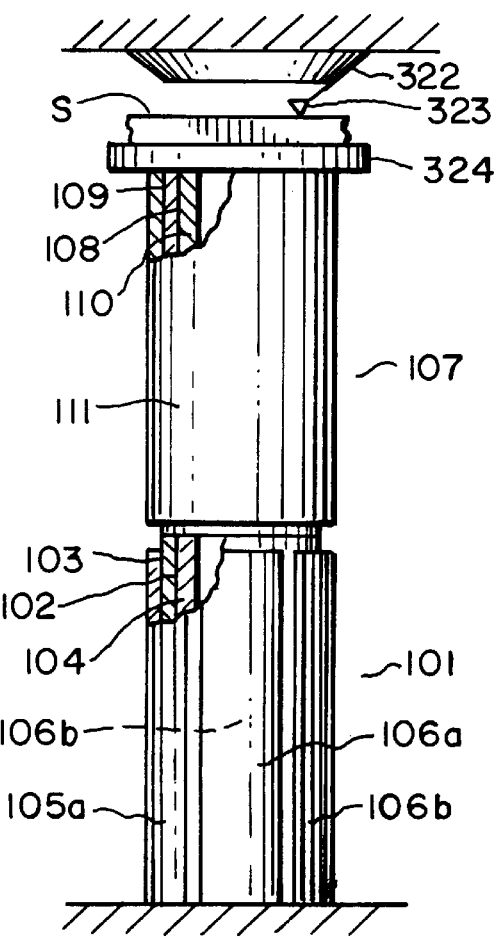
FIG. 2 is a side view, partially cut away, of another embodiment of the actuator device of the invention.

FIGS. 1 and 2 depict two embodiments 100 and 200, respectively, of the actuator device of the present invention.

FIGS. 3A and 3B depict two embodiments 310 and 320, respectively, of the scanned-probe microscope apparatus of the invention. In apparatus 310, microscope 311 is provided with actuator device 100 and a movable probe 312 having a tip 313, which moves on or near the surface S of a stationary sample. In apparatus 320, microscope 321 is provided with actuator device 200, a stationary probe 322 having a tip 323, and a movable holder 324 for the sample whose surface S is to be examined.

FIG. 1 depicts an embodiment of the invention in which actuator device 100 controls movement in a scanned-probe microscope 311 (FIG. 3A) between tip 313 of a movable scanning probe 312 and a stationary sample surface S. A first cylindrical member 101, which is connected to microscope 311, has an inner surface 102 and an outer surface 103 and is formed of electrostrictive material. On inner surface 102 is a conductive electrode layer 104. Two opposite pairs of rectangular-shaped electrodes, 105a–105b and 106a–106b, are disposed on outer surface 103. Voltages applied to electrode pairs 105a–105b and 106a–106b and electrode layer 104 control the X-Y horizontal relative movement between probe tip 313 and sample surface S.

In an alternative embodiment, electrode pairs 105a–105b and 106a–106b may be disposed on inner surface 102 of first cylindrical member 101, with electrode layer 104 disposed on outer surface 103.

In a further embodiment, the conductive layers on both the inner and outer surfaces 102 and 103, respectively, may form opposite pairs of electrodes, i.e., electrode layer 104 on inner surface 102 may also comprise two opposite pairs of rectangular-shaped electrodes (not shown), which, together with electrode pairs 105a–105b and 106a–106b on outer surface 103 enables increased X-Y scanning flexibility.

A second cylindrical member 107 has an inner surface 108 and an outer surface 109 and is formed of electrostrictive material. Inner surface 108 and outer surface 109 each have a conductive electrode layer, 110 and 111, respectively. Electrodes 110 and 111 measure the Z-direction vertical relative movement of probe tip 313 and sample surface S.

FIG. 2 depicts another embodiment of the present invention, where actuator device 200 controls movement in a scanned-probe microscope 321 (FIG. 3B) between tip 323 of a stationary probe 322 and a surface S of a sample in a movable holder 324. Device 200 includes first and second cylindrical members, 101 and 107, respectively, whose component parts and functions are the same as described for these members in device 100 (FIG. 1).

Cylindrical members 101 and 107 are formed of a electrostrictive material such as a lead-magnesium-niobate ceramic, referred to as a PMN material. PMN materials are characterized by very low hysteresis and creep, which give them substantial advantages over the PZT materials typically used in microscope positioning tubes.

The inner and outer surfaces 102, 103, 108, and 109 of members 101 and 107 may be metallized by, for example, silver or nickel to provide electrodes 104, 105a–105b, 106a–106b, 110, and 111. Members 101 and 107 may be formed by depositing the appropriate metal electrode layers on adjacent first and second sections of a single PMN cylinder. Circumferential gaps separate both the outer surface electrodes 105a–105b and 106a–106b of the first section from the outer surface electrode 111 of the second section and the first section inner surface electrode 104 from the second section inner surface electrode 110. Thin-walled PMN tubes having metallized inner and outer surfaces are available from TRS Ceramics, Inc., State College, Pa.

As previously described, electrode pairs 105a–105b and 106a–106b together with electrode layer 104 on first cylindrical member 101 control two-dimensional X-Y horizontal relative movement between probe tip 313(323) and sample surface S. Assume, for example, that electrode pair 105a–105b controls movement in the X-direction, and pair 106a–106b controls Y-direction movement. To produce an X-Y scan line, a reference negative voltage may be applied to inner surface electrode 104 while voltage ramps having opposing directions of potential change are simultaneously applied to the electrodes of the X-direction-controlling pair 105a–105b as well as to the electrodes of the Y-direction-controlling pair 106a–106b. Thus, the controlled variation of voltages applied to electrode pairs 105a–105b and 106a–106b, as just described, provides two-dimensional X-Y raster scanning of surface S by tip 313(323), or vice-versa.

Figure 4A:
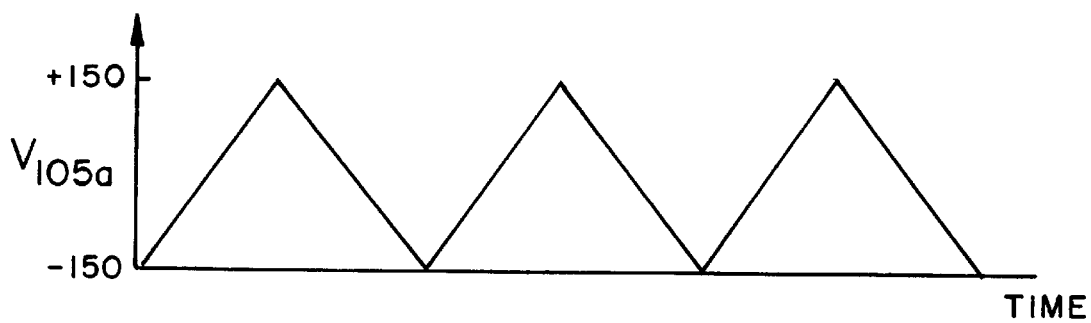
FIGS. 4A–4C depict exemplary voltage profiles for X-direction scanning by the actuator device of the invention.
Figure 4B:
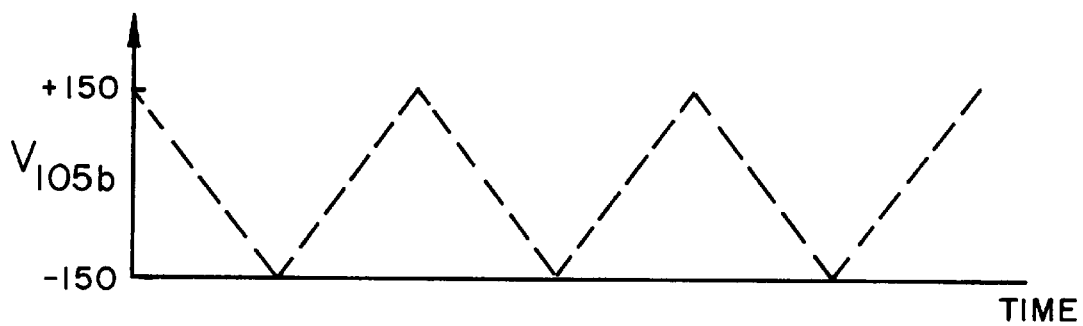
Figure 4C:
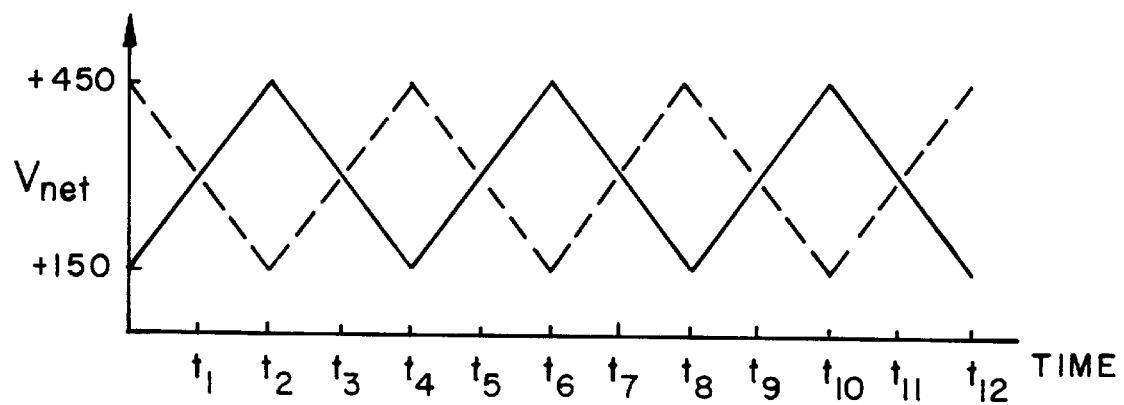

FIGS. 4A–4C depict a typical example of an X-direction scan. In FIG. 4A is shown the waveform of a voltage varying from −150 to +150 volts applied to outer surface electrode 105a. FIG. 4B shows the waveform of an oppositely varying voltage from +150 to −150 volts simultaneously applied to outer surface electrode 105b. If a reference voltage of −300 volts is applied to inner surface electrode 104, the net voltage between inner electrode 104 and outer electrodes 105a and 105b will vary between +150 and +450 volts, as shown in FIG. 4C. At times $t_0$, $t_4$, $t_8$, etc., first cylindrical member 101 is at its maximum deflection in the direction of electrode 105b. Similarly, at times $t_2$, $t_6$, $t_{10}$ etc., member 101 is at its maximum deflection in the electrode 105a direction. At times $t_1$, $t_3$, $t_5$, etc., the net voltages between electrode 104 and electrodes 105a and 105b are equal, and cylindrical member 101 is undeflected. Upon completion of the X-direction scan, voltages in the Y-direction-controlling electrodes 106a–106b are suitably adjusted to change the probe tip-sample surface position by one line width, and the X-scan is repeated.

Electrodes 110 and 111 on second cylindrical member 107 control the Z-direction vertical relative movement of probe tip 313(323) on or near sample surface S. The voltages applied to electrodes 110 and 111 are independent of the voltages applied to electrodes 105a–105b and 106a–106b on first cylindrical member 101.

The present invention has been described in detail for the purpose of illustration, but it is understood that such detail is solely for that purpose, and variations can be made therein by those skilled in the art without departing from the spirit and scope of the invention, which is defined by the following claims.

What is claimed is:

1. An electrostrictive actuator device for controlling relative movement in a scanned-probe microscope between a tip of a probe and a surface of a sample, said device comprising:

(a) a first thin-walled cylindrical member formed of electrostrictive material and connected to said microscope, and having an inner and an outer surface, said inner and outer surfaces each having a conductive layer forming at least one electrode; and (b) a second thin-walled cylindrical member formed of electrostrictive material and coaxially connected at one end with said first cylindrical member, and at the opposite end with said probe or said sample, said second cylindrical member having an inner and an outer surface, said inner and outer surfaces each having a conductive layer forming at least one electrode;

(c.) means for applying a differential voltage signal to one of said thin-walled cylindrical members to drive the probe tip from a point of origin in a positive and negative direction along a first axis and from the point of origin in a positive and negative direction along a second axis orthoganal to the first axis.

2. The actuator device of claim 1 wherein said conductive layer on said outer surface of said first cylindrical member comprises two opposite pairs of spaced apart electrodes.

3. The actuator device of claim 1 wherein said conductive layer on said inner surface of said first cylindrical member comprises two opposite pairs of spaced apart electrodes.

4. The actuator device of claim 3 wherein said conductive layer on said outer surface of said first cylindrical member comprises two opposite pairs of spaced apart electrodes.

5. The actuator device of claim 1 wherein said second cylindrical member is connected at its opposite end with said sample.

6. The actuator device of claim 1 wherein said second cylindrical member is connected at its opposite end to said probe.

7. The actuator device of claim 1 wherein said first and second cylindrical members comprise adjacent first and second sections of a single cylindrical three-dimensional scanning element, the conductive layers on each of the inner and outer surfaces of said first section being separated by a circumferential gap from the conductive layers on each of the inner and/outer surfaces, respectively, of said second section.

8. The actuator device of claim 1 wherein said electrostrictive material comprises a PMN ceramic material.

9. The actuator device of claim 1 wherein said electrodes comprise a metal selected from the group consisting of silver and nickel.

10. A scanned-probe microscope apparatus for examining a surface of a sample, said apparatus comprising:

a scanned-probe microscope having a probe provided with a tip; and an electrostrictive actuator device for producing relative movement between the probe tip and the sample surface, said device comprising:
(a) a first thin-walled cylindrical member formed of electrostrictive material and connected to said microscope, and having an inner and an outer surface, said inner and outer surfaces each having a conductive layer forming at least one electrode; and
(b) a second thin-walled cylindrical member formed of electrostrictive material and coaxially connected at one end with said first cylindrical member and at the opposite end with said probe or said sample, said second cylindrical member having an inner and an outer surface, said inner and outer surfaces each having a conductive layer forming at least one electrode;
wherein applying voltages to said electrodes on said first cylindrical member inner and outer surfaces controls the two-dimensional X-Y horizontal relative movement between the probe tip and the sample surface in both positive and negative directions along orthogonal X and Y axes, and applying voltages to said electrodes on said second cylindrical member inner and outer surfaces controls the Z-direction vertical relative movement of the probe tip on or near the sample surface.

11. The scanned-probe microscope apparatus of claim 10 wherein said second cylindrical member is connected at its opposite end with said sample.

12. The scanned-probe microscope apparatus of claim 10 wherein said second cylindrical member is connected at its opposite end to said probe.

13. The scanned-probe microscope apparatus of claim 10 wherein said first and second cylindrical members comprise adjacent first and second sections of a single cylindrical three-dimensional scanning element, the conductive layers on each of the inner and outer surfaces of said first section being separated by a circumferential gap from the conductive layers on each of the inner and outer surfaces, respectively, of said second section.

14. The scanned-probe microscope apparatus of claim 10 wherein said electrostrictive material comprises a PMN ceramic material.

15. The scanned-probe microscope apparatus of claim 10 wherein said electrodes comprise a metal selected from the group consisting of silver and nickel.

16. A process for examining the surface of a sample using a scanned-probe microscope apparatus having an electrostrictive actuator device for controlling movement between a tip of a probe and the surface of said sample, said process comprising:

a) applying selected voltages to electrodes comprising a conductive layer disposed on each of an inner and an outer surface of a first thin-walled cylindrical member formed of electrostrictive material and connected to said microscope, thereby controlling two-dimensional X-Y horizontal relative movement between said probe tip and said sample surface in both positive and negative directions along orthogonal X and Y axes; and b) applying selected voltages to electrodes comprising a conductive layer disposed on each of an inner and an outer surface of a second thin-walled cylindrical member formed of electrostrictive material and coaxially connected at one end with said first cylindrical member and at the opposite end with said probe or said sample, thereby controlling the Z-direction vertical relative movement of said probe tip on or near said sample surface.

17. The process of claim 16 wherein said conductive layer on said outer surface of said first cylindrical member comprises two opposite pairs of spaced apart electrodes.

18. The process of claim 17 comprising:

applying selected voltages to each of said opposite pairs of spaced apart electrodes on said outer surface of said first cylindrical member, thereby providing two-dimensional X-Y raster scanning of said sample surface.

19. The process of claim 16 wherein said conductive layer on said inner surface of said first cylindrical member comprises two opposite pairs of spaced apart electrodes.

20. The process of claim 19 comprising:

applying selected voltages to each of said opposite pairs of spaced apart electrodes on said inner surface of said first cylindrical member, thereby providing two-dimensional X-Y raster scanning of said sample surface.

21. The process of claim 19 wherein said conductive layer on said outer surface of said first cylindrical member comprises two opposite pairs of spaced apart electrodes.

22. The process of claim 21 comprising:

applying selected voltages to each of said opposite pairs of spaced apart electrodes, thereby providing two-dimensional X-Y raster scanning of said sample surface.

23. The process of claim 16 wherein said second cylindrical member is connected at its opposite end with said sample.

24. The process of claim 16 wherein said second cylindrical member is connected at its opposite end to said probe.

25. The process of claim 16 wherein said first and second cylindrical members comprise adjacent first and second sections of a single cylindrical three-dimensional scanning element, the conductive layers on each of the inner and outer surfaces of said first section being separated by a circumferential gap from the conductive layers on each of the inner and outer surfaces, respectively, of said second section.

26. The process of claim 16 wherein said electrostrictive material comprises a PMN ceramic material.

27. The process of claim 16 wherein said electrodes comprise a metal selected from the group consisting of silver and nickel.

\* \* \* \* \*